(12) United States Patent
Kanji et al.

(10) Patent No.: US 7,760,016 B2
(45) Date of Patent: Jul. 20, 2010

(54) ANTI-POP CIRCUITS AND METHODS FOR AUDIO AMPLIFIERS USING VARIABLE RESISTORS

(75) Inventors: Ajaykumar Kanji, Austin, TX (US); Jeffrey Blackburn, Austin, TX (US)

(73) Assignee: Integrated Device Technology, Inc., San Jose, CA (US)

( * ) Notice: Subject to any disclaimer, the term of this patent is extended or adjusted under 35 U.S.C. 154(b) by 31 days.

(21) Appl. No.: 12/173,670

(22) Filed: Jul. 15, 2008

(65) Prior Publication Data

US 2010/0013561 A1    Jan. 21, 2010

(51) Int. Cl.
    *H03F 1/14* (2006.01)
(52) U.S. Cl. .......................... 330/51; 330/149
(58) Field of Classification Search ............. 330/51, 330/149; 381/94.5, 94.9; 327/552, 553, 327/558
    See application file for complete search history.

(56) References Cited

U.S. PATENT DOCUMENTS

| | | | | |
|---|---|---|---|---|
| 5,339,363 | A * | 8/1994 | Fosgate | 381/97 |
| 6,438,237 | B1 * | 8/2002 | Nakamura | 381/27 |
| 7,050,595 | B2 * | 5/2006 | Komiyama et al. | 381/119 |
| 2007/0116303 | A1 | 5/2007 | Kanji | |
| 2007/0133828 | A1 | 6/2007 | Kanji | |
| 2007/0133829 | A1 | 6/2007 | Kanji | |

FOREIGN PATENT DOCUMENTS

EP    1 879 290 A2    1/2008

OTHER PUBLICATIONS

Integrated Device Technology, Inc., "Pop and Click Artifacts in PC Audio Systems" (White Paper), 2007, downloaded from http://www.idt.com/products/getDoc.cfm?docID=18639549 on Sep. 7, 2009.
Notification of Transmittal, International Search Report, Written Opinion of the International Searching Authority, PCT/US2009/004008, Sep. 16, 2009.

* cited by examiner

*Primary Examiner*—Robert Pascal
*Assistant Examiner*—Khiem D Nguyen
(74) *Attorney, Agent, or Firm*—Myers, Bigel, et al.

(57) ABSTRACT

Anti-pop circuits are provided for an audio amplifier that uses a power supply voltage and a ground voltage to drive a load with an audio signal that is centered about a virtual analog ground. These anti-pop circuits include a variable resistor and a capacitor that are connected to the audio amplifier to provide a low pass filter. The variable resistor has resistance that varies in response to a voltage level of the virtual analog ground, such as a difference between a voltage level of the power supply voltage and the voltage level of the virtual analog ground. The variable resistor may be a field effect transistor having a gate that is responsive to the differences between the voltage level of the power supply voltage and the voltage level of the virtual analog ground. The capacitor may be a field effect transistor, as well. Related methods are also described.

22 Claims, 13 Drawing Sheets

ANTI-POP CIRCUITS AND METHODS FOR AUDIO AMPLIFIERS USING VARIABLE RESISTORS

FIELD OF THE INVENTION

This invention relates to audio amplifiers, and more particularly to anti-pop circuits and methods for audio amplifiers.

BACKGROUND OF THE INVENTION

Audio amplifiers are widely used to process audio signals in a wide variety of electronic equipment. The electronic equipment may include stationary electronic equipment, such as desktop computers, televisions and home theater systems, or may include portable electronic equipment, such as laptop computers, personal digital assistants (PDAs), portable music players, portable DVD players, cellular telephones, etc. The equipment may include one or more integrated circuits that can include an audio amplifier. For example, the equipment may include an audio coder/decoder (CODEC) integrated circuit that processes audio signals, and includes an amplifier therein that provides an audio output that is delivered to another electronic device and/or equipment, and/or may be used to power acoustic transducers, such as speakers and/or headphones.

Unfortunately, unwanted pops may be caused in an audio amplifier when the amplifier is turned off and/or turned on. Pops may also be caused in the amplifier when it is cycled between an active state and a standby state. These pops may be annoying to a user, can potentially cause damage to the electronic device/equipment and/or acoustic transducer that is driven by the amplifier, and can even potentially cause damage to the user's hearing.

SUMMARY OF THE INVENTION

Some embodiments of the present invention provide anti-pop circuits for an audio amplifier that uses a power supply voltage and a ground voltage to drive a load with an audio signal that is centered about a virtual analog ground. These anti-pop circuits comprise a variable resistor and a capacitor that are connected to the audio amplifier to provide a low pass filter. The variable resistor has resistance that varies in response to a voltage level of the virtual analog ground. In some embodiments, the voltage level of the virtual analog ground is a difference between a voltage level of the power supply voltage and the voltage level of the virtual analog ground.

In some embodiments, the variable resistor comprises a field effect transistor having a gate that is responsive to the difference between the voltage level of the power supply voltage and the voltage level of the virtual analog ground. In other embodiments, the capacitor comprises a field effect transistor, as well. Moreover, the audio amplifier may include a current source and a current mirror, and the variable resistor and the capacitor may be connected between the current source and the current mirror. The current source may comprise a field effect transistor that is configured to operate as a diode.

According to other embodiments of the present invention, an anti-pop circuit also includes a power-down field effect transistor that is connected to the audio amplifier, and that has a gain that varies in response to the voltage level of the virtual analog ground. In some embodiments, the function of the voltage level of the virtual analog ground is a difference between a voltage level of the ground voltage and the voltage level of the virtual analog ground. Moreover, in some embodiments, the power-down field effect transistor may be connected between the power supply voltage and the current mirror of the audio amplifier. In yet other embodiments, the variable resistor and capacitor are serially connected between the current source and the current mirror.

In some embodiments, the gate of the variable resistor field effect transistor may be connected to an operational amplifier having inputs that are connected to the power supply voltage and to the virtual analog ground, and an output that is connected to the gate of the field effect transistor. In other embodiments, the gate of the power-down field effect transistor may be connected to an operational amplifier having inputs that are connected to the virtual analog ground and to the ground voltage, and an output that is connected to the gate of the power-down field effect transistor.

Other embodiments of anti-pop circuits for an audio amplifier include an operational amplifier having inputs that are connected to the power supply voltage and to the virtual analog ground, and having an output. First and second field effect transistors are also provided, having source/drain regions that are serially connected between the current source and the current mirror. The first field effect transistor has a gate that is connected to the output of the operational amplifier.

In other embodiments, a second operational amplifier may be provided, having inputs that are connected to the ground voltage and the virtual analog ground, and having an output. A third field effect transistor has source/drain regions that are connected between the power supply voltage and the current mirror, and a gate that is connected to the output of the second operational amplifier. In some embodiments, the current source, the current mirror and the first, second and third field effect transistors may all be embodied as PMOS transistors. In other embodiments, the current source may be configured to provide a diode, the first transistor may be configured to provide a variable resistor, and the second transistor may be configured to provide a fixed capacitor.

Methods of reducing pops during power-up/power-down of an audio amplifier that uses a power supply voltage and ground voltage to drive a load with an audio signal that is centered about a virtual analog ground and that includes a resistor/capacitor filter, may also be provided according to other embodiments of the invention. In these methods, a resistance of the resistor in the resistor/capacitor filter is varied in response to a voltage level of the virtual analog ground. The resistance may be varied in response to a difference between a voltage level of the power supply voltage and the voltage level of the virtual analog ground.

Accordingly, some embodiments of the present invention can provide anti-pop circuits/methods for an audio amplifier that uses a power supply voltage and a ground voltage to drive a load with an audio signal. These anti-pop circuits/methods include a variable resistor and a capacitor that are connected to the audio amplifier to provide a low-pass filter. The variable resistor is responsive to a control signal that varies more slowly than the power supply voltage during power-up of the audio amplifier. A power-down field effect transistor also may be provided that is responsive to a control signal that varies more quickly than the power supply voltage during power-down of the audio amplifier.

DETAILED DESCRIPTION

Figure 1:
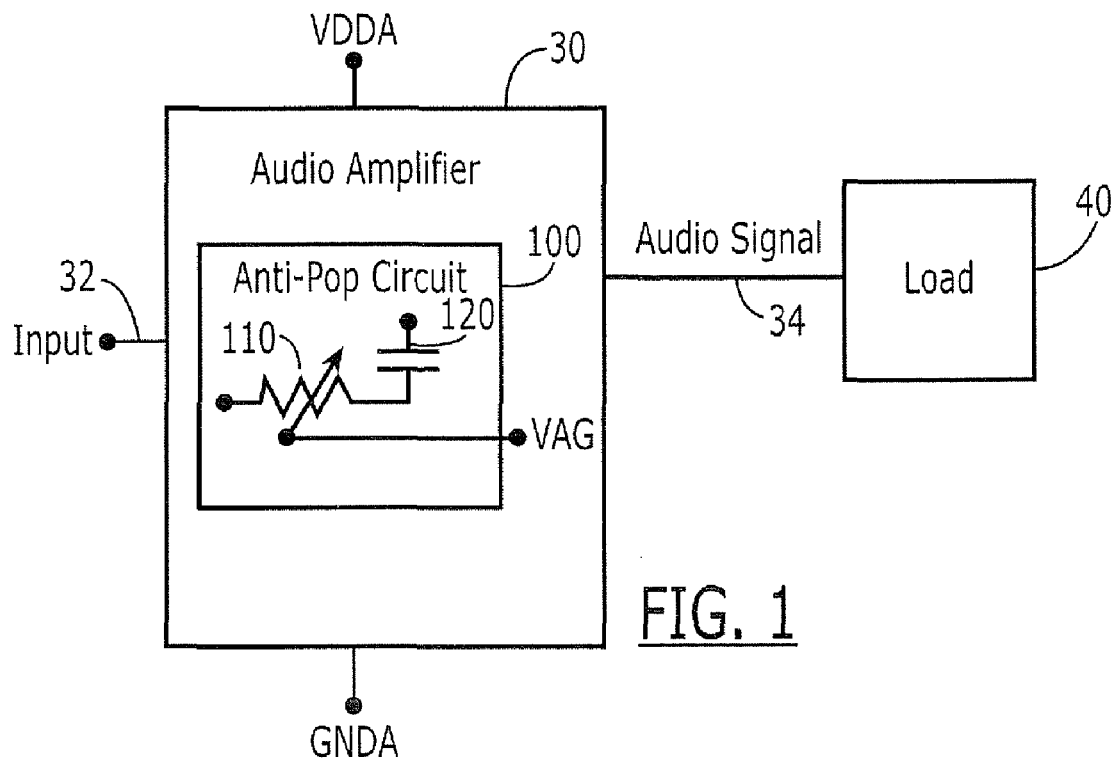
FIGS. 1-7 are combined block diagrams and circuit diagrams of audio amplifiers including anti-pop circuits according to various embodiments of the present invention.

Exemplary embodiments now will be described more fully hereinafter with reference to the accompanying figures, in which embodiments are shown. There may be alternate embodiments in many alternate forms, and the embodiments described herein should not be construed as limiting.

Accordingly, while exemplary embodiments are susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including", and variants thereof, when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "connected" or "responsive" to another element, and variants thereof, it can be directly connected or responsive to the other element, or intervening elements may be present. In contrast, when an element is referred to as being "directly connected" or "directly responsive" to another element, and variants thereof, there are no intervening elements present. As used herein the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another.

Exemplary embodiments are described below with reference to block diagrams of circuits and with reference to a flowchart. However, the functionality of a given block of the block diagrams/flowcharts may be separated into multiple blocks and/or the functionality of two or more blocks of the block diagrams/flowcharts may be at least partially integrated.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1-7 are combined block/circuit diagrams of audio amplifiers including anti-pop circuits according to various embodiments of the present invention. As shown in FIGS. 1-7, these audio amplifiers 30 are configured to amplify an input signal 32 to supply an amplified audio signal 34 to a load 40 using power a supply voltage VDDA and a ground voltage GNDA. The audio amplifier may operate using class A, class AB and/or other classes of operation that are well-known to those having skill in the art. The input signal 32 may be audio signal that is derived from a CODEC and/or another input source, and may constitute music, speech, audio tracks of movies and/or other signals that may be generated internally, reproduced from a storage medium and/or obtained from an external source. The audio signal 34 is configured to drive the load 40, which may be another electronic device and/or an electro-acoustic transducer, such as a loudspeaker or earphone. Moreover, since the audio amplifier operates between a positive or negative power supply VDDA, and ground GNDA, but the audio signal 34 has positive and negative portions, the audio amplifier generates a virtual analog ground (VAG), about which the audio signal 34 is centered. Typically, VAG is approximately VDDA/2.

It will be understood that, as used herein, the terms "input signal", "audio signal", "supply voltage VDDA", "ground voltage GNDA", "virtual analog ground VAG" and other similar terms are used to connote a terminal or conductive line that is configured to carry and/or distribute the associated voltage or signal in a circuit during operation of the circuit. This usage conforms to common usage of these terms in the electronics field.

Impulses in the audio signal 34 may be generated during power up and/or power-down of the audio amplifier 30 and/or when the audio amplifier 30 transitions between a standby state and an active state. These pops can damage the audio amplifier 30, the load 40 and/or the ears of the user.

Anti-pop circuits/methods may be provided in the audio amplifier 30 according to various embodiments of the present invention, as will now be described in connection with FIGS.

1-9 and 12-16C. It will be understood, however, that various embodiments shown in FIGS. 1-9 and 12-16C may be combined in various combinations and sub-combinations, so that embodiments of the present invention should not be limited to those distinct embodiments shown in FIGS. 1-9 and 12-16C.

Referring now to FIG. 1, an anti-pop circuit 100 according to some embodiments includes a variable resistor 110 and a capacitor 120 connected to the audio amplifier 30, to provide a low pass filter. The variable resistor 110 has a resistance that varies in response to a voltage level of the virtual analog ground VAG that is generated in the audio amplifier 30.

Figure 2:
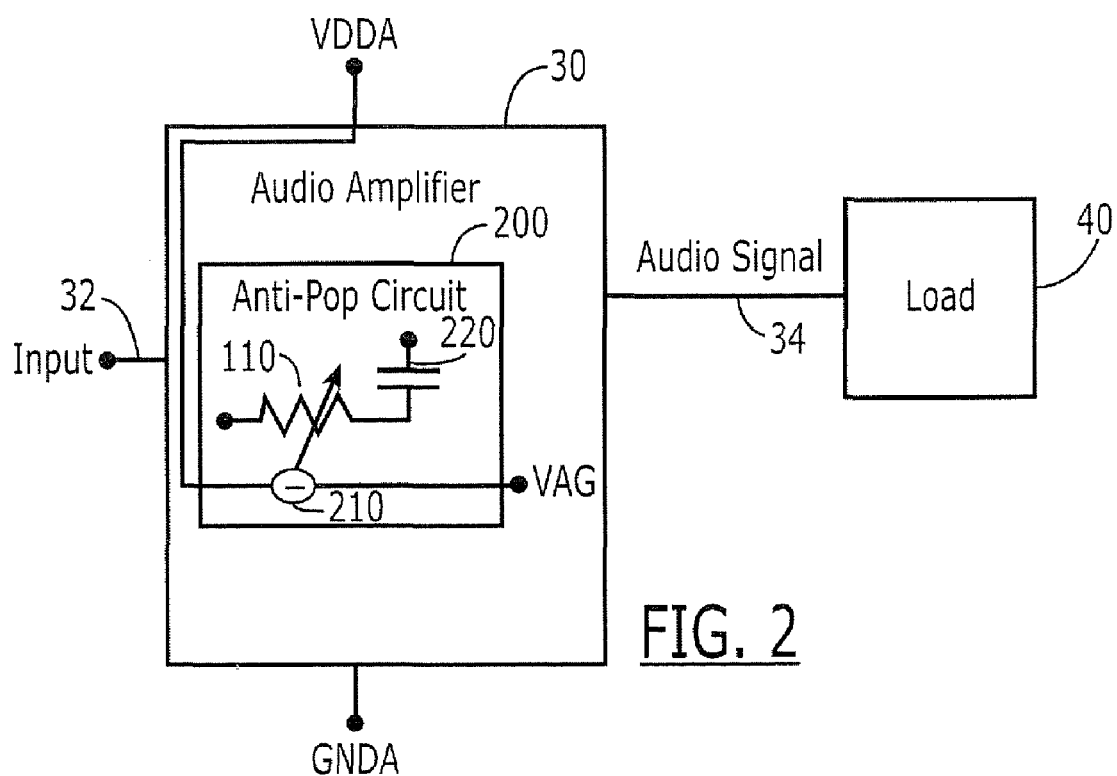

FIG. 2 illustrates other embodiments of the present invention wherein an anti-pop circuit 200 includes a variable resistor 110 and a capacitor 120. The variable resistor 110 has a resistance that varies in response to a difference between the voltage level of the power supply voltage VDDA and the voltage level of the virtual analog ground VAG. This difference may be provided by a summing node 210.

Figure 3:
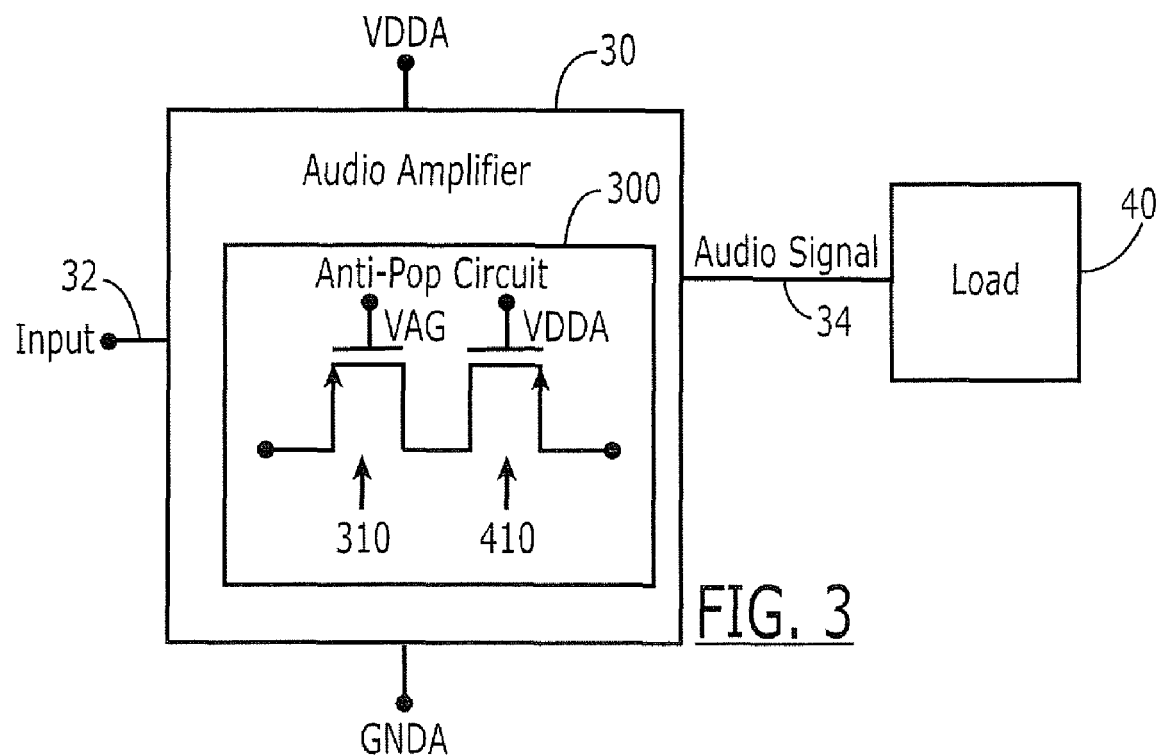

FIG. 3 illustrates other embodiments of anti-pop circuits 300 wherein the variable resistor comprises a first field effect transistor 310 having a gate that is responsive to the virtual analog ground VAG. The capacitor also comprises a second field effect transistor 410, the capacitance of which is fixed, for example by connecting the gate thereof to the power supply voltage VDDA.

Figure 4:
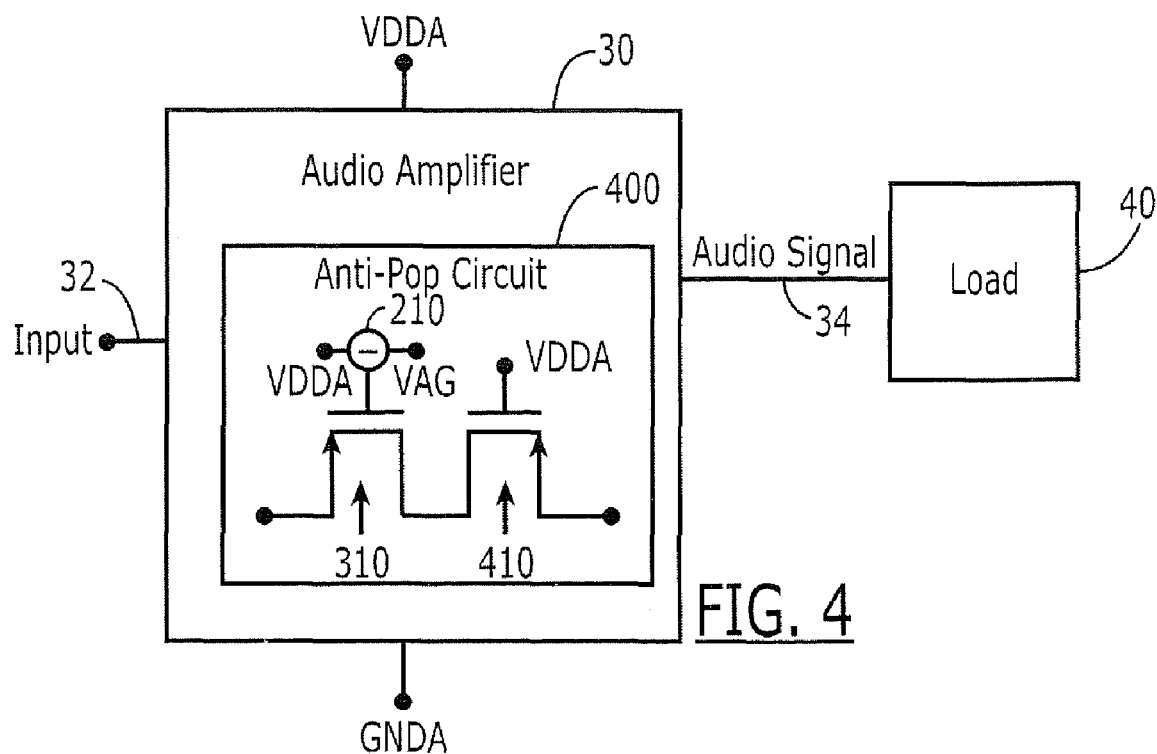

FIG. 4 illustrates other embodiments of anti-pop circuits 400 wherein the first field effect transistor 310 has a gate that is responsive to a difference between the power supply voltage VDDA and the virtual analog ground VAG. A summing node 210 may be used to provide this difference.

Figure 5:
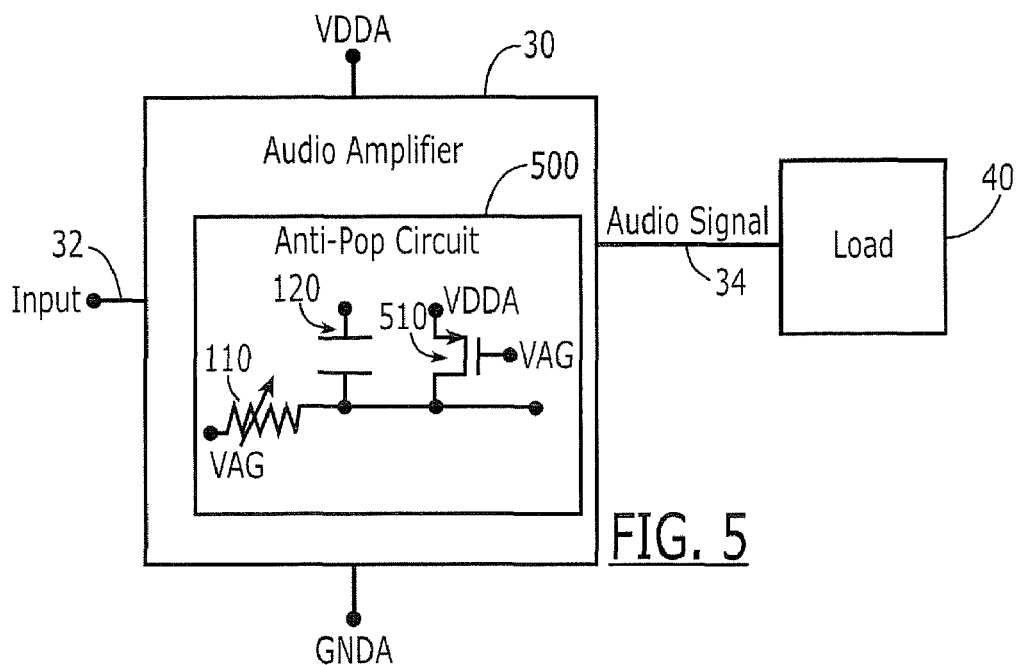

FIG. 5 illustrates other embodiments of anti-circuit pop circuits 500 that include a variable resistor 110 and a capacitor 120 as described above, and also include a power-down (third) field effect transistor 510 that is connected to the audio amplifier 30 and that has a gain that varies in response to the voltage level of the virtual analog ground VAG. For example, in embodiments of FIG. 5, the gate of the power-down field effect transistor 510 is connected to VAG.

Figure 6:
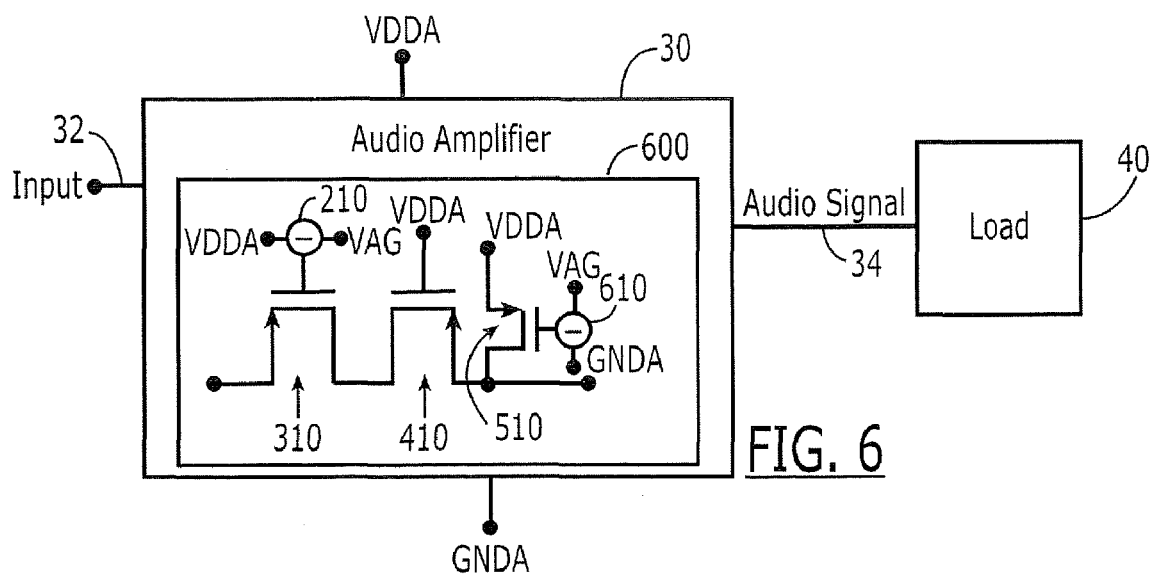

FIG. 6 illustrates other embodiments of the invention wherein the power-down field effect transistor 510 has a gain that varies in response to a difference between the virtual analog ground VAG and the ground voltage GNDA. This difference may be provided by a summing node 610.

Figure 7:
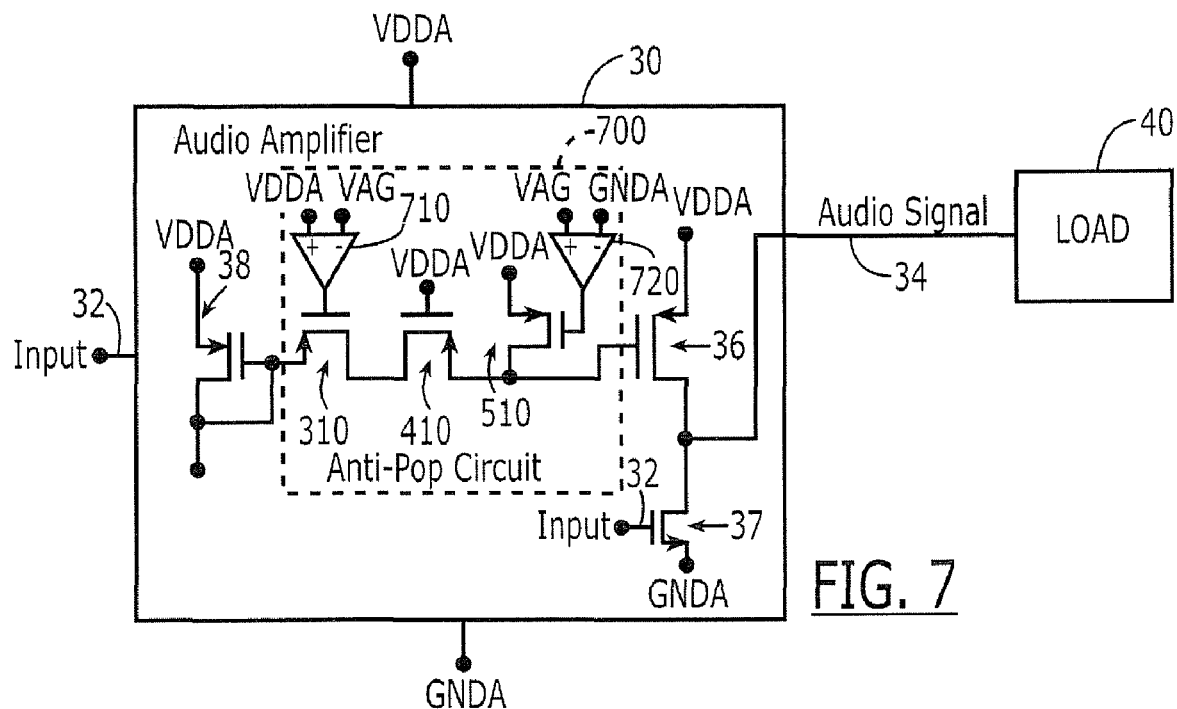

FIG. 7 is a block diagram of other embodiments of anti-pop circuits 700, showing a connection to the internal circuitry of the audio amplifier 30. In particular, the audio amplifier 30 includes a current mirror 36 and a current source 38. The current source 38 may embodied as a field effect transistor that is configured to operate as a diode by virtue of the gate-to-drain connection thereof. A driver transistor 37 is also provided.

As shown in FIG. 7, the variable resistor embodied by the first field effect transistor 310 and the capacitor embodied by the second field effect transistor 410 are connected between the current source 38 and the current mirror 36. The power-down transistor 510 is connected between the power supply voltage VDDA and the current mirror 36. Moreover, as shown in FIG. 7, the variable resistor 310 is controlled by a difference between the power supply voltage VDDA and the virtual analog ground VAG using an operational amplifier 710 as an embodiment of a summing node 210. Similarly, the power-down field effect transistor 510 is controlled by a difference between the virtual analog ground VAG and the ground voltage GNDA using an operational amplifier 720 as an embodiment of a summing node 610. Accordingly, the operational amplifiers 710 and 720 can operate as a control block for an anti-pop circuit.

In other embodiments of FIG. 7, the power-down transistor 510 and its associated operational amplifier 720 need not be provided, similar to embodiments of, for example, FIG. 4. Thus, FIG. 7 illustrates other embodiments of an anti-pop circuit that includes an operational amplifier 710 having inputs that are connected to the power supply voltage VDDA and the virtual analog ground VAG, and having an output. First and second field effect transistors 310 and 410, respectively, are provided, having source/drain regions that serially connected between the current source 38 and the current mirror 36. The first field effect transistor 310 has a gate that is connected to the output of the operational amplifier 710.

FIG. 7 also illustrates other embodiments of the present invention that also include a second operational amplifier 720 having inputs that are connected to the ground voltage GNDA and the virtual analog ground VAG, and having an output. Moreover, a third field effect transistor 510 has source/drain regions that are connected between the power supply voltage VDDA and the current mirror 36, and a gate that is connected to the output of the second operational amplifier 720. As also illustrated, in some embodiments of FIG. 7, the current source 38, the current mirror 36 and the first, second and third field effect transistors 310, 410 and 510, respectively, are all embodied as PMOS transistors. Moreover, the current source 38 may be configured to provide a diode, the first transistor 310 may be configured to provide a variable resistor and the second transistor 410 may be configured to provide a fixed capacitor.

Figure 8:
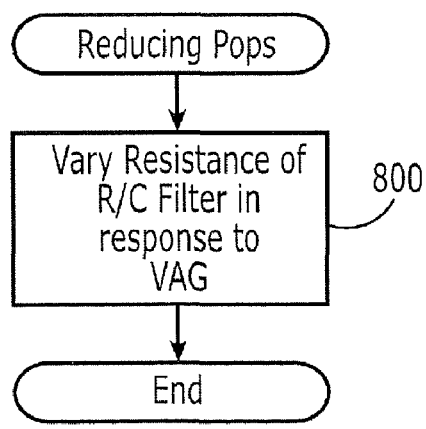
FIG. 8 is a flowchart of operations that may be performed to reduce pops according to various embodiments of the present invention.

FIG. 8 is a block diagram of methods of reducing pops during power-up/power-down of an audio amplifier according to various embodiments of the present invention. As shown in FIG. 8, at Block 800, a resistance of a resistor in a resistor/capacitor filter is varied in response to a voltage level of the virtual analog ground. Other analogous method embodiments using the other circuits that are described herein may also be provided.

Accordingly, FIGS. 1-8 illustrate embodiments of the present invention, wherein an anti-pop circuit/method includes a variable resistor and a capacitor connected to the audio amplifier to provide a low-pass filter. The variable resistor is responsive to a control signal that varies more slowly than the power supply voltage during power-up of the audio amplifier. A power-down field effect transistor also may be provided that is responsive to a control signal that varies more quickly than the power supply voltage during power-down of the audio amplifier.

Figure 9:
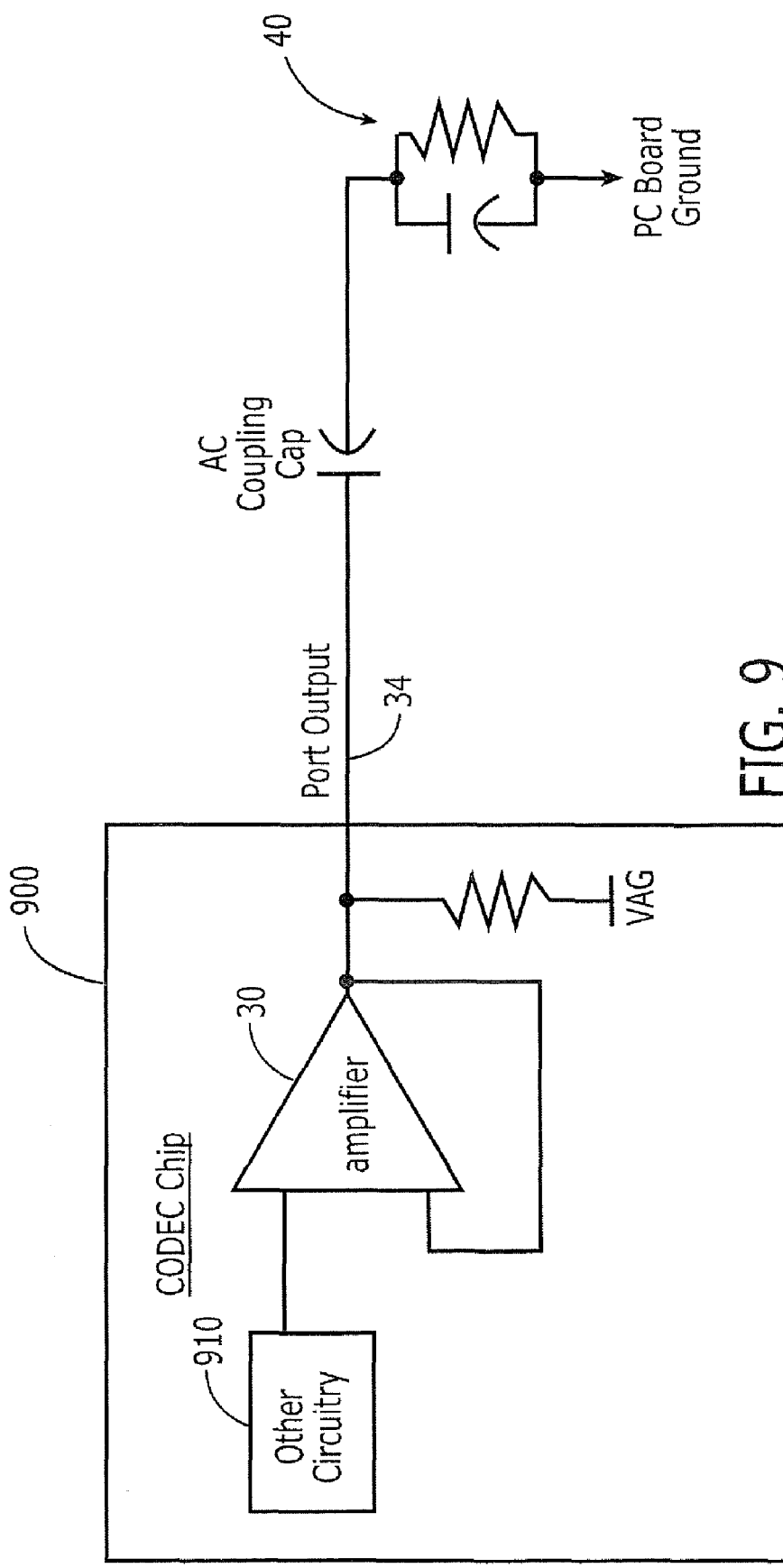
FIG. 9 is a combined block and circuit diagram of a CODEC chip driving a load, according to various embodiments of the present invention.

Additional embodiments of the present invention will now be described. In some embodiments, the audio amplifier 30 may be included in a CODEC chip. FIG. 9 is a combined block and circuit diagram of a CODEC chip 900 driving a load 40. The CODEC chip 900 can provide and/or record audio signals. The port output 34 of a CODEC chip provides audio drive signal 34 in the form of electrical voltages and currents and is converted into sound via speakers or another load 40. A simple speaker can be modeled as a resistive and capacitive load 40. The CODEC can include other analog/digital circuitry 910, such as digital processing circuitry.

Figure 10:
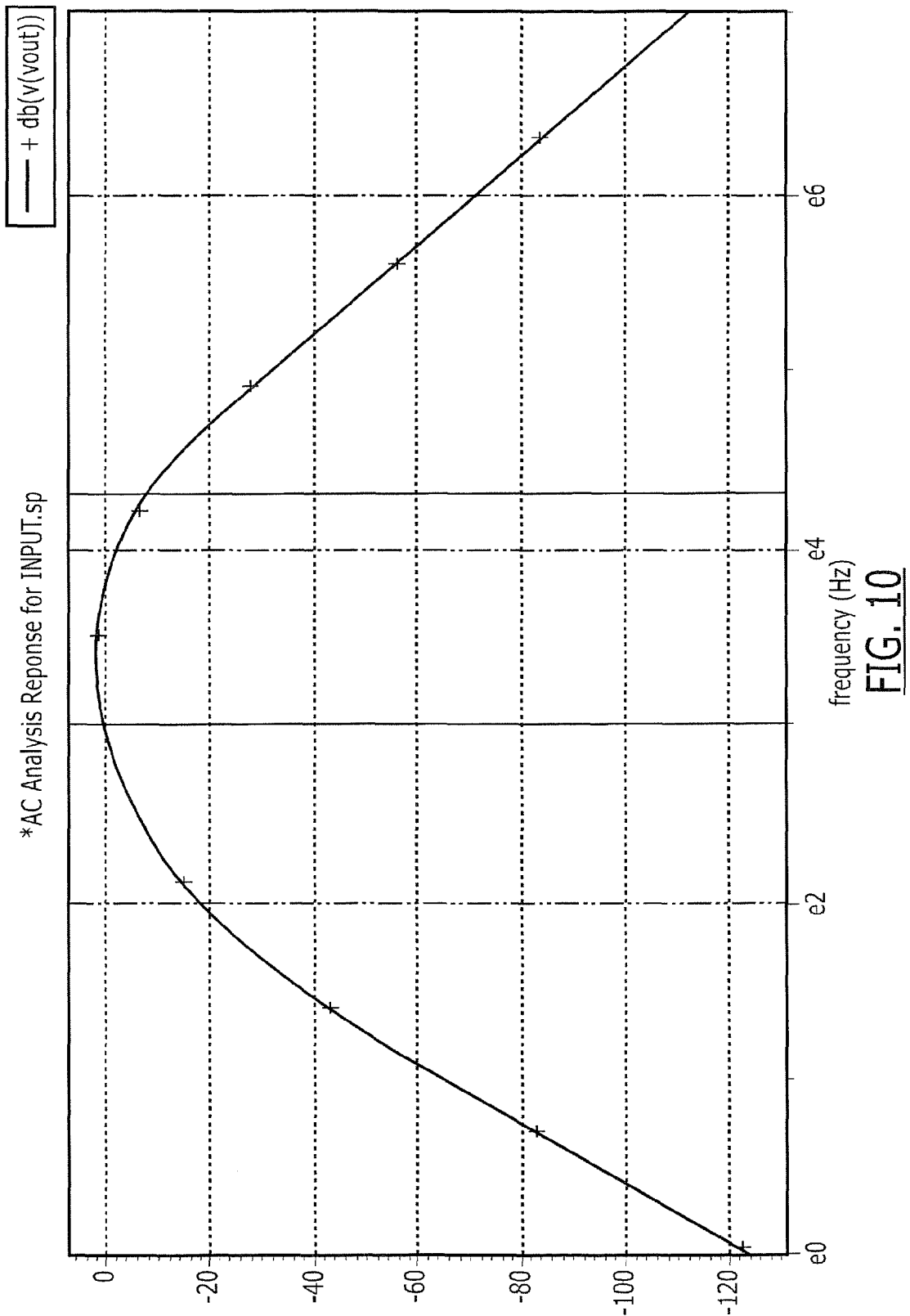
FIG. 10 graphically illustrates an A-weighted filter function.

In audio, unwanted pops that are output by the speaker are not only an annoyance, but also can cause damage to the speaker or the human ear. The audio output 34 is filtered by both the speaker and the human ear. The human ear generally has a type of filter function as shown in FIG. 10. The human ear has a range of about 20 Hz to about 20 KHz and will tend to filter or attenuate both the low and the high frequencies in this range, while passing mid-range frequencies with little or no attenuation.

FIG. 10 shows an A-weighting filter function used to mimic the ear by filtering the electrical signal provided by the port output 34 to the speaker load 40 to determine what a user would hear. The A-weighted filter function shows that a signal at 1 KHz is passed directly through at 0 dB while signals approaching 20 Hz and 20 KHz are attenuated. To enhance the user's experience, it may be desirable to ensure unwanted audio pops do not occur at a high enough amplitude within the hearing range.

Various embodiments of the invention may arise from discovery that a main source of pops appears to be DC changes in the port output voltage, which could be considered an impulse response depending on how fast the voltage changes. The impulse response is an instantaneous change in voltage in the time domain, which translates to energy passed to all frequencies in the frequency domain. The amplitude of the DC voltage change generally will determine the amplitude in the frequency domain. Thus, both the rate of change in the voltage and the amplitude of change will generally determine whether a human will be able to hear the pop. Empirical results from lab measurements have led to a rule of thumb that if a voltage changes less than 1 Volt per second (i.e., less than −60 dBV), the pop will not be heard.

Various embodiments of the invention can reduce or avoid a pop when power is applied to the chip. Since the "chip common mode ground", also called "virtual analog ground" (VAG), is different than the "PC board ground", also called "ground voltage" (GNDA), various embodiments of the invention can use the VAG voltage in a filter circuit, which provides that the rate of change is less than about 1 Volt per second when power is applied or removed.

Various embodiments of the invention may also arise from discovery that, during power up, the VAG generally starts at ground and ramps up slowly at the same time the ports turn on with a slight DC offset from ground. This slight DC offset is caused by the fact that the driver at the output could not drive completely to ground because the NMOS driver 37 shown in FIG. 7 has finite output impedance and generally must sink the class-A output mirror current from the current mirror 36. The offsets were on the order of about 1 mV to about 10 mV.

At power up, the chip may be in a low power (standby) state with only references and ports powered up but no signal paths enabled. The digital power can turn on before the analog power so that the signals from the digital section of the other circuits 910 of the chip 900 are driving the analog circuits in their proper states when analog power is applied. In some embodiments, all the output amplifiers may be powered with one quarter of the normal bias current to reduce the offset by about a quarter. The lower bias the current also helps achieve lower power consumption for standby.

Figure 11:
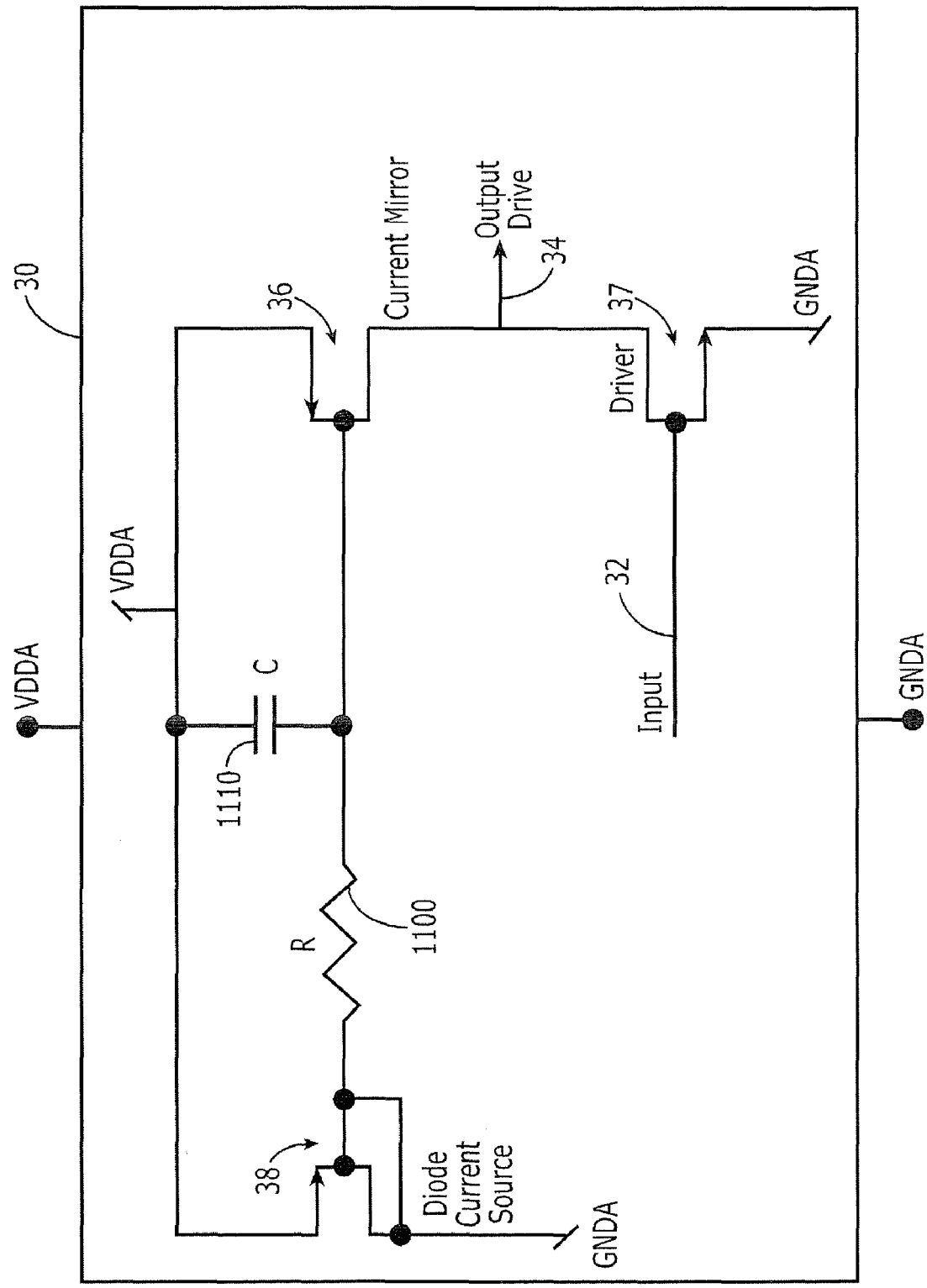
FIG. 11 conceptually illustrates an anti-pop circuit using a fixed resistor.

Simulations with the PMOS current source 38 off and ramped up with a fixed resistor R 1100 and a fixed capacitor C 1110 as shown in FIG. 11 resulted in the start up offset being reduced to under 1 mV in most cases. Since the ramping of the VAG voltage is independent of the PMOS class A mirror 36 turning on, the output 34 can still pop depending on the ramp rate of VAG. If the VAG ramps much quicker than the current source 38 turn on rate, then the amplifier 30 can quickly jump to the VAG setting once there is enough current supplied by the current source 38 to allow the amplifier to operate correctly in a closed loop manner. If the VAG ramps much slower that the current source 38 turn on rate, then the amplifier 30 can again have a DC offset from the VAG generator due to the NMOS output driver 37 having finite output impedance. This may not be a problem if the current mirror 36 was turned on at a slow enough rate such that the DC offset was pushed out of band, but this would generally need a very large resistor R 1100 or a clocked digital mirror Digital-to-Analog Converter (DAC) that can increase the current mirror 36 at less than 1 Volt per second. The clocked digital mirror DAC is generally expensive in chip area. A large resistor is also expensive in chip area.

Various embodiments of the invention may also arise from discovery that the ramp of the PMOS current mirror 36 should have a relationship to the VAG ramp to reduce the error between the output and VAG. In some embodiments of the invention, the resistor 1100 was replaced by a variable resistor 110 (e.g., FIG. 1), which may be embodied as a PMOS transistor 310 (e.g., FIG. 3), to allow the resistance value to be controllable. Some embodiments can also provide an additional power-down transistor 510 (e.g., FIG. 5) so that the gate of the PMOS current mirror 36 stays off while applying power since this net became high impedance due to the filter.

Accordingly, some embodiments of the present invention provide anti-pop circuits/methods that include a variable resistor and a capacitor connected to the audio amplifier to provide a low-pass filter. The variable resistor is responsive to a control signal that varies more slowly than the power supply voltage during power-up of the audio amplifier. A power-down field effect transistor also may be provided that is responsive to a control signal that varies more quickly than the power supply voltage during power-down of the audio amplifier.

Figure 12:
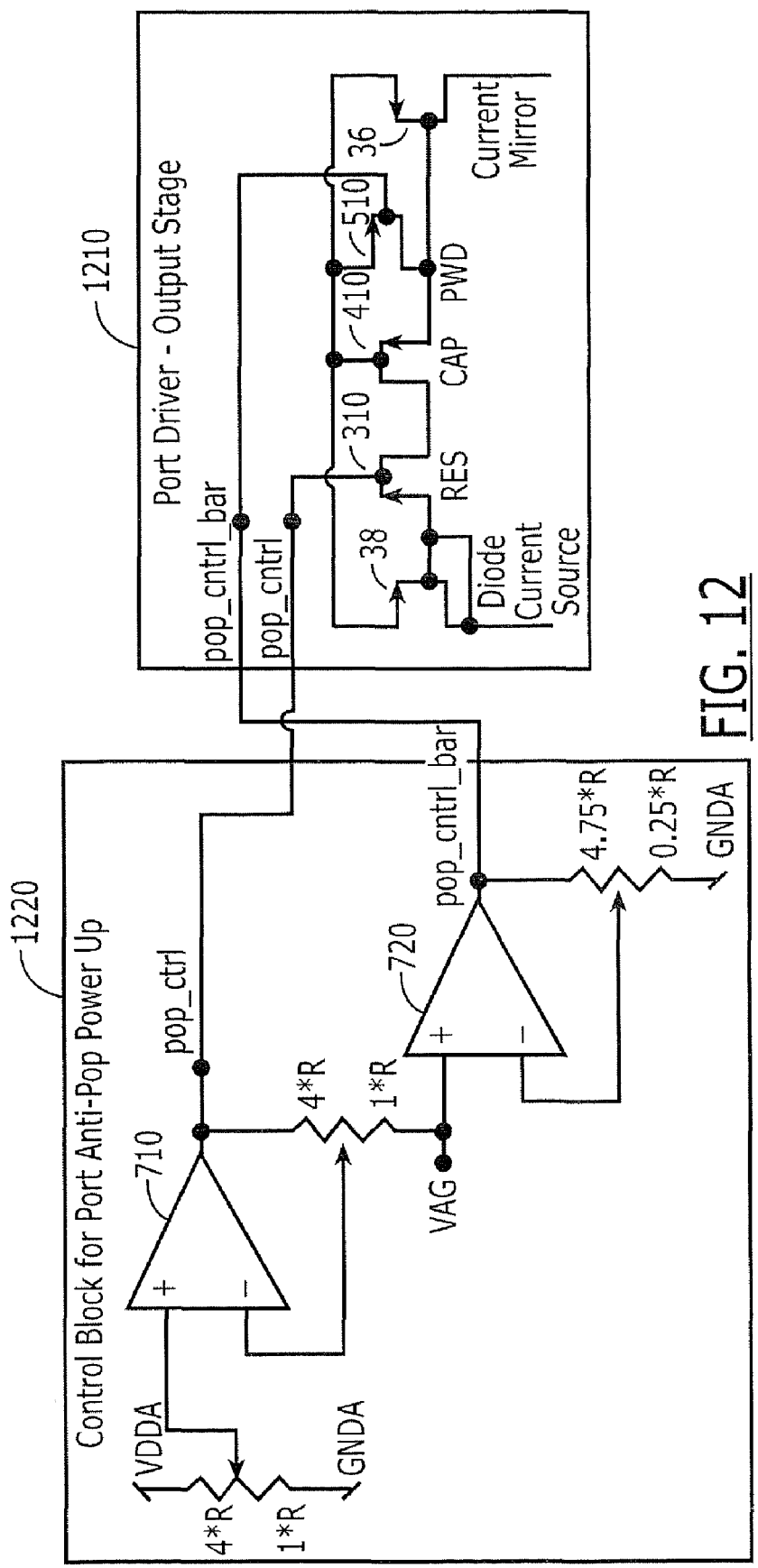
FIG. 12 is a combined block diagram and circuit diagram illustrating anti-pop circuits according to various other embodiments of the present invention.

FIG. 12 illustrates embodiments of FIG. 7, wherein the output stage of the amplifier 30 and the anti-pop circuit 700 are grouped into a port driver-output stage 1210, and the operational amplifier circuits that provide the control signals to the first transistor 310 that operates as a variable transistor and to the power-down transistor 510 are grouped in a block 1220 that is labeled as a "Control Block For Port Anti-Pop Power Up". Since the first transistor 310 embodies a variable resistor, it is labeled "RES". Since the second transistor 410 is configured as a capacitor, it is labeled "CAP". Finally, the power-down transistor 510 is also labeled "PWD".

The control block 1220 can mimic the VAG ramp. The control block 1220 generates a signal called "pop_cntrl", which is inverted with respect to VAG and has a steeper slope, to control the PMOS transistor 310 acting as a controlled or variable resistor. Moreover, the control block 1220 generates another signal, "pop_cntrl_bar", which is reverse of the "pop_cntrl" signal with an even steeper slope, for the power-down transistor 510. The slopes are controlled by the resistor values for the operational amplifiers 710/720, to apply different gains to the input signal VAG. The operational amplifiers will saturate to the different power supply rails to provide the final digital signal. The analog ramps allow a smooth transition between the final digital amplitudes.

Figure 13:
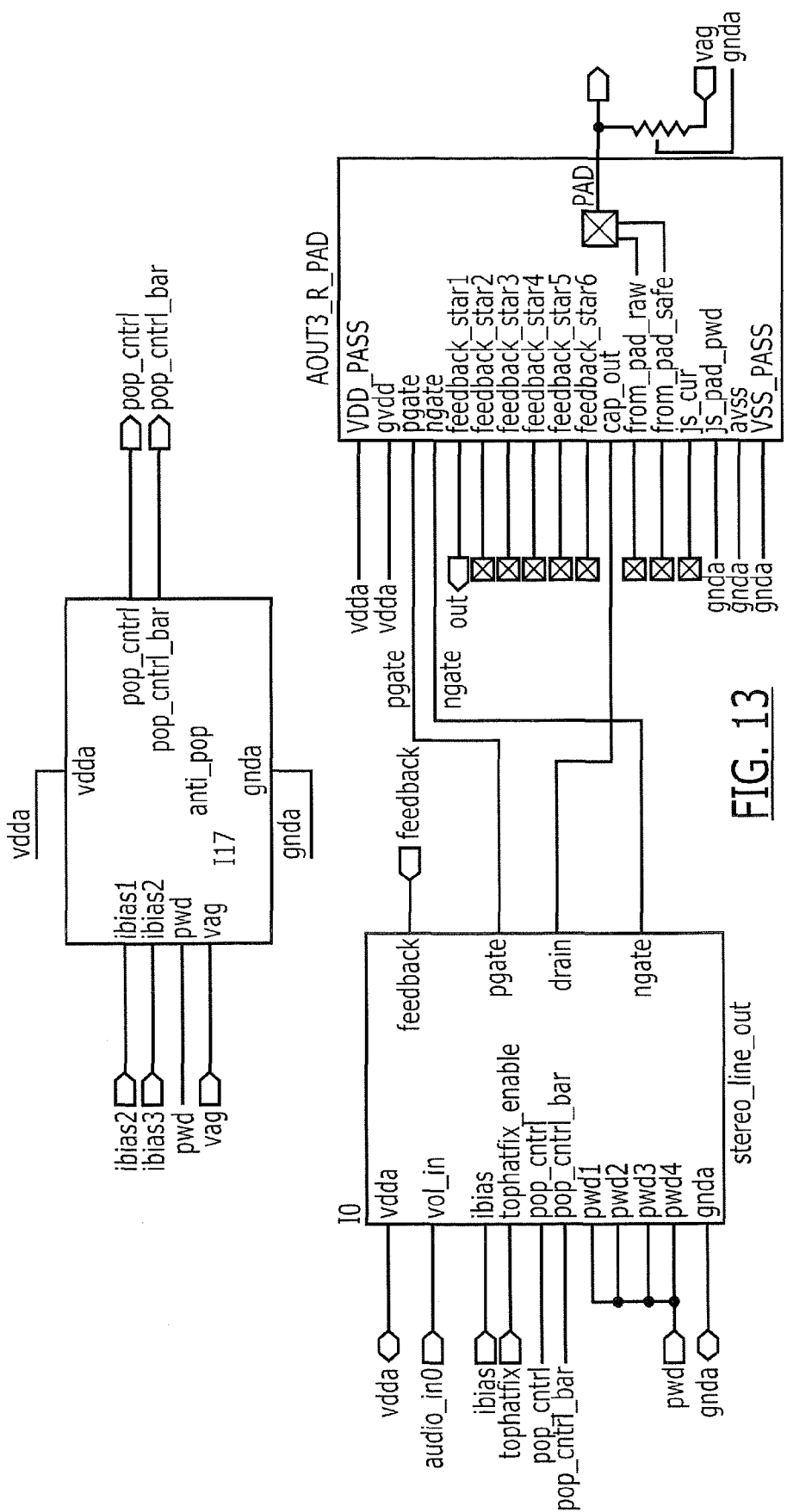
FIG. 13 is a block diagram of a test bench schematic that may be used to simulate an amplifier that includes an anti-pop circuit according to some embodiments of the present invention.
Figure 14:
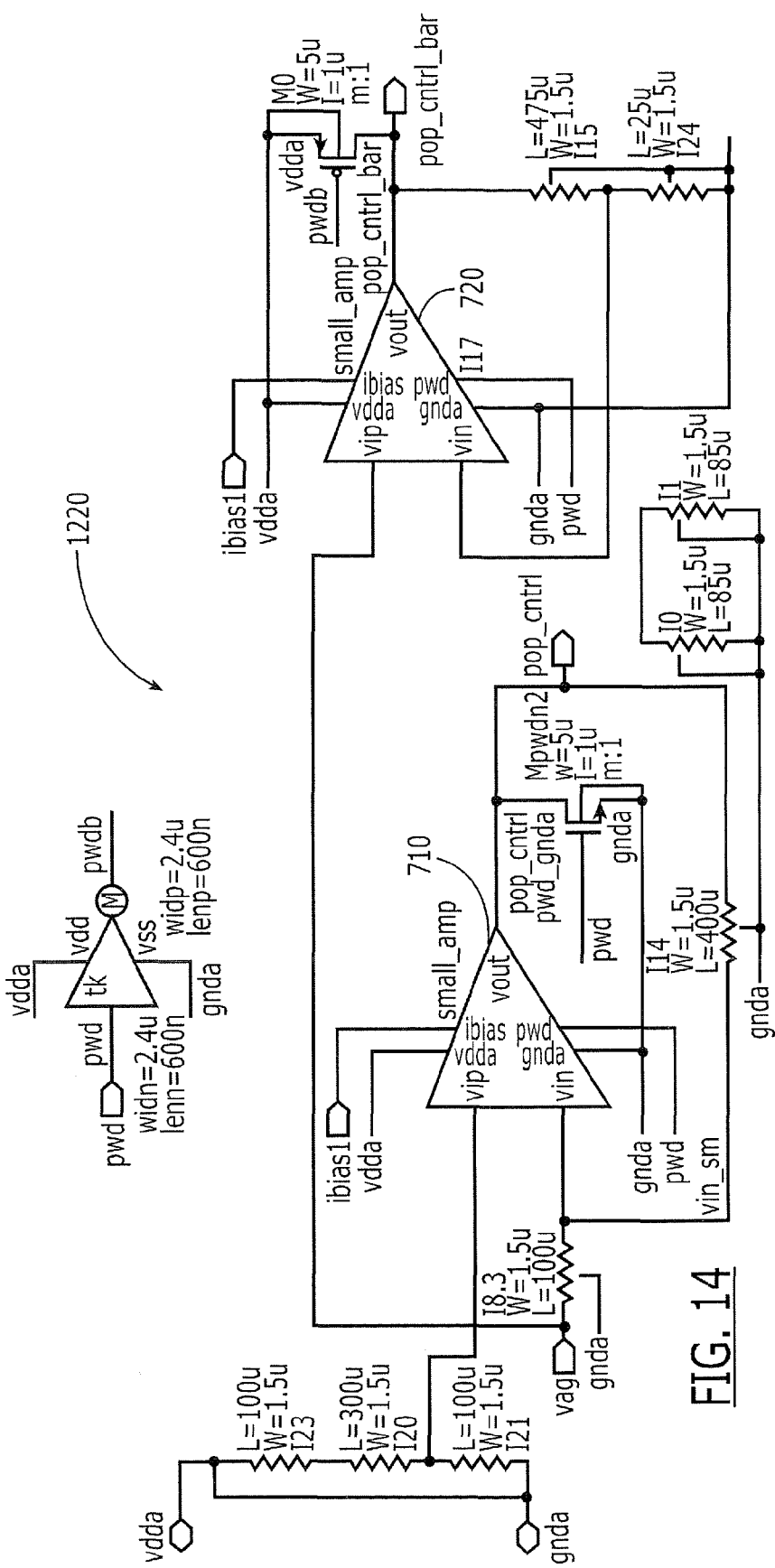
FIG. 14 is a detailed schematic diagram of an anti-pop control block according to some embodiments of the present invention.
Figure 15:
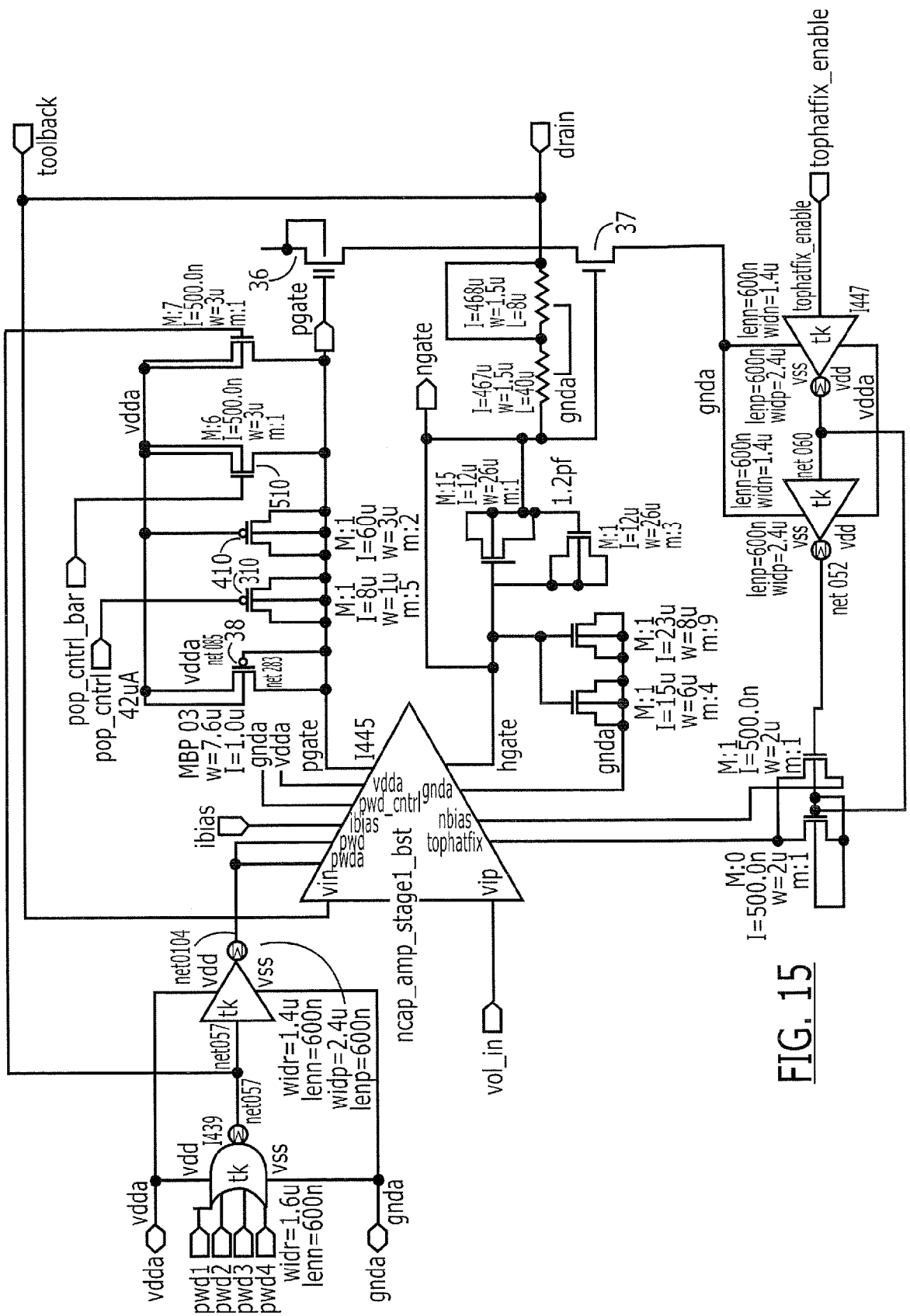
FIG. 15 is a detailed schematic diagram of an amplifier including an anti-pop circuit according to some embodiments of the present invention.

FIG. 13 shows a test bench schematic that was used to simulate performance criteria of various embodiments of the invention, including anti-pop performance during power up. FIG. 14 is a detailed schematic diagram of an anti-pop control block 1220 of FIG. 12. FIG. 15 is a detailed schematic diagram of a port drive-output stage of FIG. 12. Signals are summarized in the Table below:

TABLE

| Port Name | Type | Description |
|---|---|---|
| vdda | analog power | Analog supply (3.15 V-5.25 V) |
| gnda | analog power | Analog ground |
| vag | analog input voltage | Virtual ground for analog |

TABLE-continued

| Port Name | Type | Description |
|---|---|---|
| pop_cntrl | analog output signal | Analog ground starred from the pad to the bottom of the port sense resistors |
| pop_cntrl_bar | analog output signal | Analog input voltage from the voltage divider for ports A, B, C, & D |
| ibias1 | analog iref-bias | 10uA$_{nom}$ bias current into one amplifier |
| ibias2 | analog iref-bias | 10uA$_{nom}$ bias current into an amplifier |
| pwd | control signal | This powers down the block. |

The anti-pop control block of FIG. 14 includes two operational amplifiers 710, 720 to control the ramp rates of "pop_cntrl" and "pop_cntrl_bar" signals with respect to VAG and power supply. A simplified diagram is shown on the left side in FIG. 12, while the schematic version is given in FIG. 14. The signal "pop_cntrl" follows the VAG ramp with an inverted relationship and steeper slope. Since the "pop_cntrl" signal is used to control the PMOS transistor 310, the PMOS transistor resistance will vary depending on the relationship between VDDA and the "pop_cntrl" signal. Thus, the PMOS transistor 310 acts as a very high impedance resistor, initially when "pop_cntrl" is the same voltage as the VDDA power supply, and decreases to a switch level resistance when "pop_cntrl" ramps down to GNDA. The second amplifier 720 was added follow VAG, only with a steeper slope. The output of this amplifier 720 controls the power-down transistor 510 and helps keep the PMOS current mirror 36 off when power is initially applied. The "pop_cntrl_bar" signal will slowly shut off the power-down transistor 510 while the "pop_cntrl" signal reduces the impedance on the PMOS resistor 310. This will allow a diode voltage 38 to be applied to the class-A current mirror 36 in a controlled manner, reducing the in-band DC movements on the port output.

The lineout and/or headphone output ports can have the three PMOS transistors 310, 410 and 510 added to them according to various embodiments of the invention. A first transistor 310 acts as the variable resistor controlled by "pop_cntrl" signal. A second transistor 410 acts as a fixed capacitor, while the third transistor 510 acts a power-down device controlled by "pop_cntrl_bar". FIG. 15 is a schematic diagram of a line out amplifier according to various embodiments of the invention. Similar changes can be made to a headphone port and/or other audio amplifier. A headphone port may use a class-AB output stage rather than class-A of the line out, which may cause a difference between the line out and headphone out anti-pop performance during power up. When VAG has some residual charge (for example, about 50 mV to about 150 mV) left between powering down and powering back up, the negative disturbance on the headphone port may be larger. This may result in a larger pop at the port. However, as long as VAG is below a 150 mV, the performance can remain within 3 dB at the lineout port.

Figure 16A:
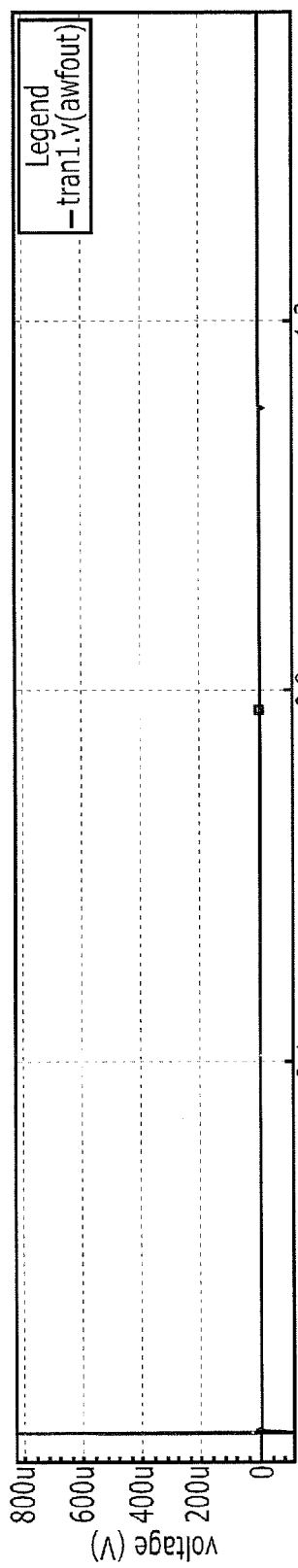
FIGS. 16A-16C graphically illustrate various simulated signals in circuits of FIGS. 14 and 15.
Figure 16B:
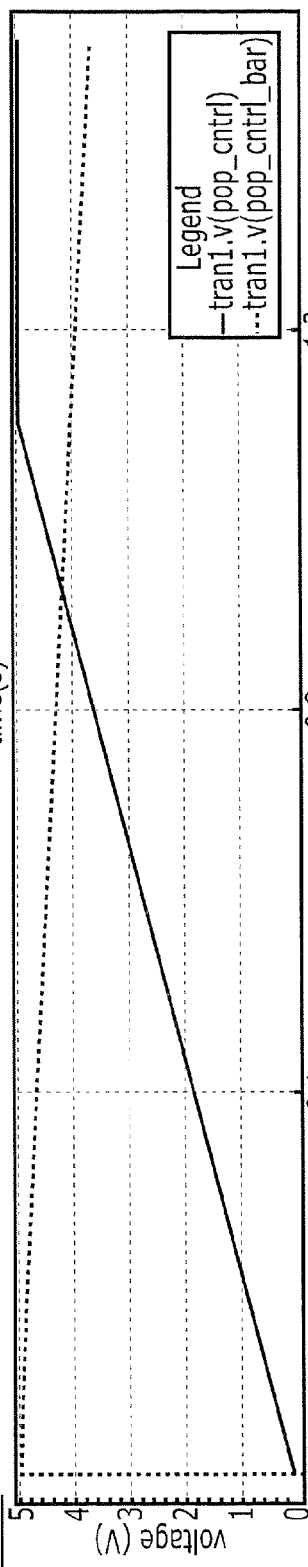
Figure 16C:
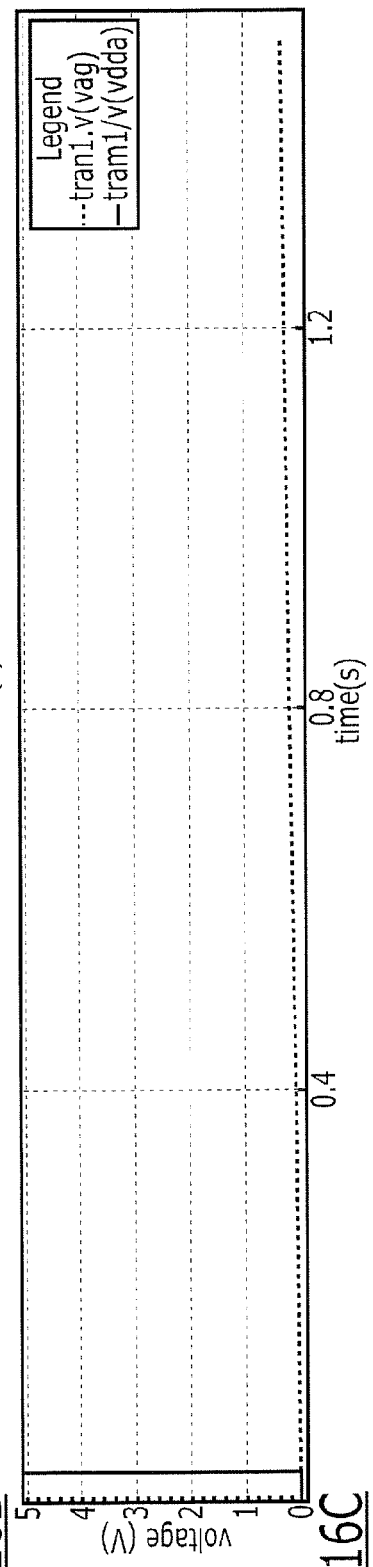

The test bench shown in FIG. 13 was used to simulate a power-up anti-pop circuit according to some embodiments of the invention. FIGS. 16A-16C graphically illustrate a relationship between different signals and the amplifier's performance as it is powered up in a simulation.

FIG. 16A illustrates the A-weighted output of the amplifier. FIG. 16B displays the "pop_cntrl" and "pop_cntrl_bar" signals, while FIG. 16C illustrates the rise of the power supply at 100 μV and the slow rise of VAG. The power-on pop as shown in FIG. 16A is measured at 800 μV peak (about −65 dB) after the power is applied. Also notice the small glitch in FIG. 16A that occurs at 1.1 sec. This occurs because the "pop_cntrl_bar" has gone high enough to turn the power-down transistor 510 off. The test bench was checked for THD, noise, AC parameters, power consumption, stability and offsets across process corners to ensure the anti-pop circuit does not affect the performance. The pop performance was not checked over process corner due to the long simulation times needed.

Figure 17:
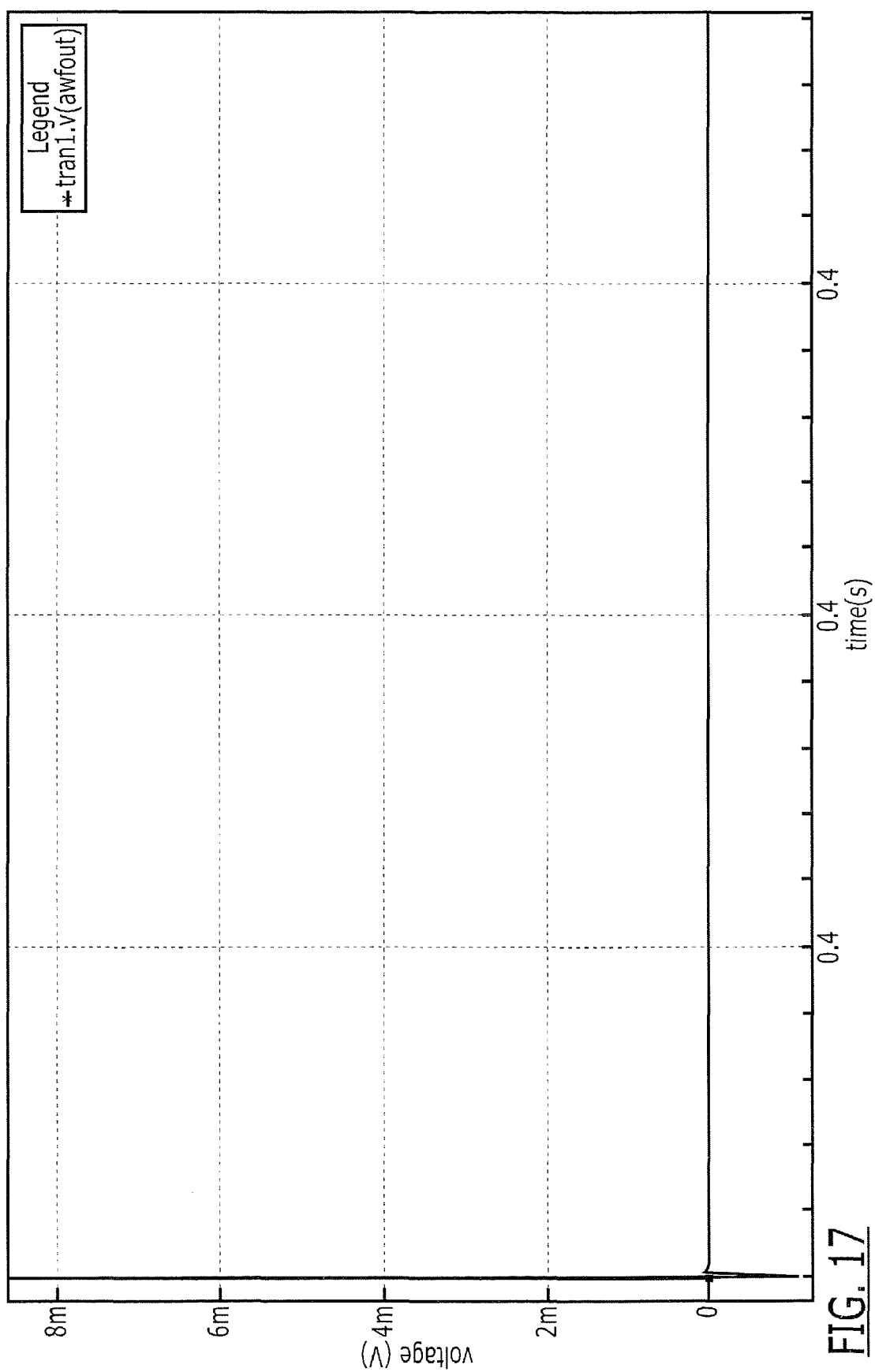
FIG. 17 graphically illustrates the creation of an impulse in a circuit of FIG. 15 that does not include an anti-pop circuit according to embodiments of the present invention.

FIG. 17 shows the A-weighted port performance of the test bench when the anti-pop circuitry is removed, for example by disconnecting the transistors 310, 410 and 510 from the circuit. This results in a pop that is 10 times worse (20 dB). Similar simulations were done on the top (test bench) level. The results on the top level were even worse, as expected. The main reason for worse results expected in the top level simulations is that the test bench reference currents are assumed stable, which is not the case at the top level simulations. The top level simulation results show to be between −45 dB to −50 dB, which is a great improvement from the worse than −20 dB results without the circuit.

Accordingly, anti-pop circuits and/or methods according to various embodiments of the present invention can reduce or eliminate the occurrence of pops during turn-on/turn-off of an audio amplifier. For example, embodiments of the present invention may reduce unwanted in-band audio pops at the lineout and/or headphone ports when power is first applied to a CODEC chip using the on-chip analog ground generated signal (VAG) to control the available port output current.

The CODEC chips are AC-coupled through capacitors to allow the chip to be powered with one ground referenced VDDA supply and internal chip audio signals centered around an internally generated analog ground VAG between 0V and VDDA (e.g., generally around VDDA/2), while the external board audio signal can be centered around the board ground. Since impulses from the ports cause the speakers to pop, which could damage the speaker or a human ear, it is desirable to reduce the pops, caused by the CODEC ports. Since power can be applied at different slew rates (i.e., dv/dt), and the internal ground is referenced to VDDA, which should be ramped up slowly to reduce pops due to DC shifts at the port, it may be difficult to determine when to turn on the amplifier. To add to the problem, the amplifiers driving the ports generally will not operate correctly until the VDDA power supply is large enough to allow the amplifier to close the loop. Turning the amplifier on too early or too late will generally cause an impulse to be applied to the port and transferred to the speaker, causing an unwanted pop.

Prior to using the variable resistance controlled by ramping of the internal ground reference according to various embodiments of the invention, a constant RC filter was used to slowly power up the PMOS current source. This reduced the pop at the port, but was very uncontrollable. Changing the ramp rate of the power supply would cause changes in the internal ground ramping, which would result in different pops, depending on the relationship of the output driver voltage and the internal ground voltage. Moreover, an adequately sized fixed resistor consumed excessive chip area. Alternatively, a digital ramping of the class-A output current may be used, which then slowly ramps the internal ground reference on differential outputs for a high end part. This was also expensive in both chip area and power-up time. In contrast, embodiments of the invention can be effective to reduce pops, while being relatively simple to implement and can consume little chip area.

Since PC manufacturers are becoming more interested in eliminating of external amplifiers to control the unwanted pops on the speakers due to area and price constraints, controlling the impulses on the CODEC ports is becoming more important. It is very difficult to control impulses at the ports when power is first applied due to the transistors not being biased correctly until a certain amplitude of power supply is applied. Having different ground references between the CODEC chip and speakers makes this issue even more problematic. Embodiments of the invention can reduce or eliminate this problem.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An anti-pop circuit for an audio amplifier that uses a power supply voltage and a ground voltage to drive a load with an audio signal that is centered about a virtual analog ground, the anti-pop circuit comprising:
    a variable resistor and a capacitor connected to the audio amplifier to provide a low pass filter, the variable resistor having a resistance that varies in response to a voltage level of the virtual analog ground,
    wherein the variable resistor comprises a field effect transistor having a gate that is responsive to the difference between the voltage level of the power supply voltage and the voltage level of the virtual analog ground.

2. An anti-pop circuit for an audio amplifier that uses a power supply voltage and a ground voltage to drive a load with an audio signal that is centered about a virtual analog ground, the anti-pop circuit comprising:
    a variable resistor and a capacitor connected to the audio amplifier to provide a low pass filter, the variable resistor having a resistance that varies in response to a voltage level of the virtual analog ground,
    wherein the capacitor comprises a field effect transistor.

3. An anti-pop circuit for an audio amplifier that uses a power supply voltage and a ground voltage to drive a load with an audio signal that is centered about a virtual analog ground, the anti-pop circuit comprising:
    a variable resistor and a capacitor connected to the audio amplifier to provide a low pass filter, the variable resistor having a resistance that varies in response to a voltage level of the virtual analog ground,
    wherein the audio amplifier comprises a current source and a current mirror, and wherein the variable resistor and the capacitor are connected between the current source and the current mirror.

4. A circuit according to claim 3 wherein the current source comprises a field effect transistor that is configured to operate as a diode.

5. An anti-pop circuit for an audio amplifier that uses a power supply voltage and a ground voltage to drive a load with an audio signal that is centered about a virtual analog ground, the anti-pop circuit comprising:
    a variable resistor and a capacitor connected to the audio amplifier to provide a low pass filter, the variable resistor having a resistance that varies in response to a voltage level of the virtual analog ground; and
    a power-down field effect transistor connected to the audio amplifier and having gain that varies in response to the voltage level of the virtual analog ground.

6. A circuit according to claim 5 wherein the gain varies in response to a difference between a voltage level of the ground voltage and the voltage level of the virtual analog ground.

7. A circuit according to claim 5 wherein the audio amplifier comprises a current source and a current mirror, and wherein the power-down field effect transistor is connected between the power supply voltage and the current mirror.

8. A circuit according to claim 7 wherein the variable resistor and the capacitor are serially connected between the current source and the current mirror.

9. A circuit according to claim 1 further comprising an operational amplifier having inputs that are connected to the power supply voltage and to the virtual analog ground and an output that is connected to the gate of the field effect transistor.

10. A circuit according to claim 6 further comprising an operational amplifier having inputs that are connected to the virtual analog ground and to the ground voltage and an output that is connected to a gate of the power-down field effect transistor.

11. A CODEC chip that includes therein an audio amplifier having an anti-pop circuit, the audio amplifier using a power supply voltage and a ground voltage to drive a load with an audio signal that is centered about a virtual analog ground, the anti-pop circuit comprising a variable resistor and a capacitor connected to the audio amplifier to provide a low pass filter, the variable resistor having a resistance that varies in response to a voltage level of the virtual analog ground.

12. An anti-pop circuit for an audio amplifier that includes a current source and a current mirror for the current source and that uses a power supply voltage and a ground voltage to drive a load with an audio signal that is centered about a virtual analog ground, the anti-pop circuit comprising:
    an operational amplifier having inputs that are connected to the power supply voltage and to the virtual analog ground and having an output; and
    first and second field effect transistors having source/drain regions that are serially connected between the current source and the current mirror, the first field effect transistor having a gate that is connected to the output of the operational amplifier.

13. A circuit according to claim 12 wherein the operational amplifier is a first operational amplifier, the circuit further comprising:
    a second operational amplifier having inputs that are connected to the ground voltage and to the virtual analog ground and having an output; and
    a third field effect transistor having source/drain regions that are connected between the power supply voltage and the current mirror and a gate that is connected to the output of the second operational amplifier.

14. A circuit according to claim 13 wherein the current source, the current mirror and the first, second and third field effect transistors are all embodied as PMOS transistors.

15. A circuit according to claim 12 wherein the current source comprises a diode, the first transistor is configured to provide a variable resistor and the second transistor is configured to provide a fixed capacitor.

16. An audio amplifier that includes an anti-pop circuit according to claim 12.

17. A method of reducing pops during power up/power-down of an audio amplifier that uses a power supply voltage and a ground voltage to drive a load with an audio signal that is centered about a virtual analog ground and that includes a resistor/capacitor filter, the method comprising:
    varying a resistance of the resistor in the resistor/capacitor filter in response to a voltage level of the virtual analog ground.

18. A method according to claim 17 wherein the resistance is varied in response a difference between a voltage level of the power supply voltage and the voltage level of the virtual analog ground.

19. An anti-pop circuit for an audio amplifier that uses a power supply voltage and a ground voltage to drive a load with an audio signal, the anti-pop circuit comprising:
   a variable resistor and a capacitor connected to the audio amplifier to provide a low pass filter, the variable resistor being responsive to a control signal that varies more slowly than the power supply voltage during power-up of the audio amplifier.

20. A circuit according to claim 19 wherein the variable resistor comprises a field effect transistor having a gate that is responsive to the control signal that varies more slowly than the power supply voltage during power-up of the audio amplifier.

21. A circuit according to claim 19 wherein the capacitor comprises a field effect transistor.

22. A circuit according to claim 19 further comprising a power-down field effect transistor connected to the audio amplifier and is responsive to a control signal that varies more quickly than the power supply voltage during power-down of the audio amplifier.

* * * * *